US006668342B2

(12) United States Patent
Wood et al.

(10) Patent No.: US 6,668,342 B2
(45) Date of Patent: Dec. 23, 2003

(54) APPARATUS FOR A RADIATION HARDENED CLOCK SPLITTER

(75) Inventors: Neil E. Wood, Fairfax, VA (US); Eric J. Hatch, Windsor, CO (US)

(73) Assignee: Bae Systems Information and Electronic Systems Integration, Inc., Nashua, NH (US)

( * ) Notice: Subject to any disclaimer, the term of this patent is extended or adjusted under 35 U.S.C. 154(b) by 334 days.

(21) Appl. No.: 09/838,131

(22) Filed: Apr. 20, 2001

(65) Prior Publication Data

US 2001/0030567 A1 Oct. 18, 2001

Related U.S. Application Data

(60) Provisional application No. 60/200,348, filed on Apr. 28, 2000.

(51) Int. Cl.$^7$ .............................. G06K 5/04; G11B 20/20
(52) U.S. Cl. .................... 714/700; 327/257; 327/291; 327/259; 713/500; 365/156
(58) Field of Search .................... 714/700, 726, 714/727, 744, 814; 713/500–503; 327/291–299, 239–244, 252–259, 34; 365/156, 189.05, 194

(56) References Cited

U.S. PATENT DOCUMENTS

| 4,809,226 A | 2/1989 | Ochoa, Jr. |
| 5,053,848 A | 10/1991 | Houston et al. |
| 5,111,429 A | 5/1992 | Whitaker |

(List continued on next page.)

FOREIGN PATENT DOCUMENTS

| EP | 0357980 | 3/1990 |
| EP | 0432846 A1 | 6/1991 |

OTHER PUBLICATIONS

International Search Report, dated Apr. 10, 1999 for International Application No. PCT/US99/12442.
IBM Technical Disclosure Bulletin, vol. 32, No. 12, dated May 1990, pp. 389–392.
7th NASA Symposium on VLSI Design 1998 titled "Mitigating Single Event Upsets From Combinational Logic"; authors: K. Joe Hass, Jody W. Gambles, Bill Walker and Mike Zampaglione.
"Temporally Redundant Latch for Preventing Single Event Disruptions in Sequential Integrated Circuits"; authors: Dr. David G. Mavis and Paul H. Eaton; published by Mission Research Corporation on Sep. 8, 1998 and revised on Oct. 8, 1998.

*Primary Examiner*—Albert Decady
*Assistant Examiner*—Guy Lamarre
(74) *Attorney, Agent, or Firm*—Swidler Berlin Shereff Friedman, LLP

(57) ABSTRACT

A clock splitter circuit provides a radiation hardened pair of adjustably non-overlapping complementary clocks. The circuit includes a pair of clock inverter legs. Each clock inverter leg can include an and-or-inverter (AOI) circuit having a first input coupled to an overlap_en signal, a second input coupled to an inverted overlap_en signal, a third input coupled to an inverted first clock input signal, and a fourth input coupled to an second clock input signal that is substantially 180 degrees out of phase with the first clock input signal. Each clock inverter leg can further include an asymmetric variable delay (AVD) circuit having an input coupled to an output of the first AOI circuit and an input coupled to a waitr_ signal that can be used to delay and adjust breadth of non-overlap. Each leg can further include a tri-state inverter circuit having a first input coupled to an output of the AVD circuit, and a second input coupled to the inverted first clock input signal. Each leg can further include an inverter having an input coupled to an output of the tri-state inverter circuit, and an output coupled to a first clock output signal.

8 Claims, 7 Drawing Sheets

U.S. PATENT DOCUMENTS

| | | |
|---|---|---|
| 5,135,882 A | 8/1992 | Karniewicz |
| 5,175,605 A | 12/1992 | Pavlu et al. |
| 5,307,142 A | 4/1994 | Corbett et al. |
| 5,311,070 A | 5/1994 | Dooley |
| 5,406,513 A | 4/1995 | Canaris et al. |
| 5,485,420 A | 1/1996 | Lage et al. |
| 5,504,703 A | 4/1996 | Bansal |
| 5,525,923 A | 6/1996 | Bialas, Jr. et al. |
| 5,559,461 A | 9/1996 | Yamashina et al. |
| 5,764,089 A | 6/1998 | Partovi et al. |
| 5,870,332 A | 2/1999 | Lahey et al. |
| 5,920,575 A * | 7/1999 | Gregor et al. ............... 714/726 |
| 5,977,809 A * | 11/1999 | Wang et al. ................. 327/239 |

* cited by examiner

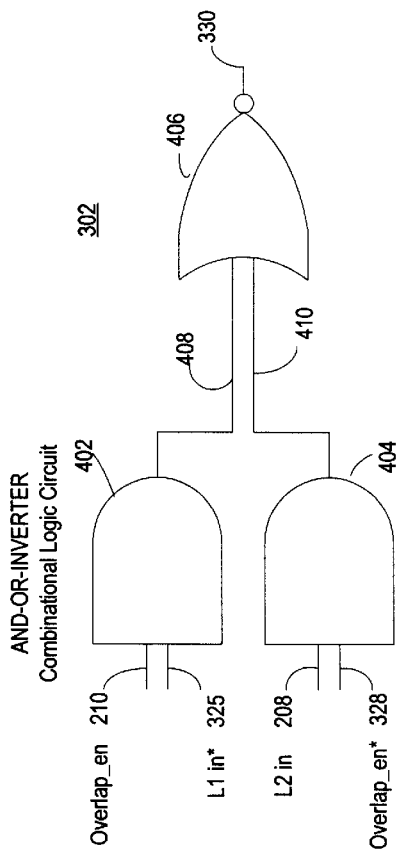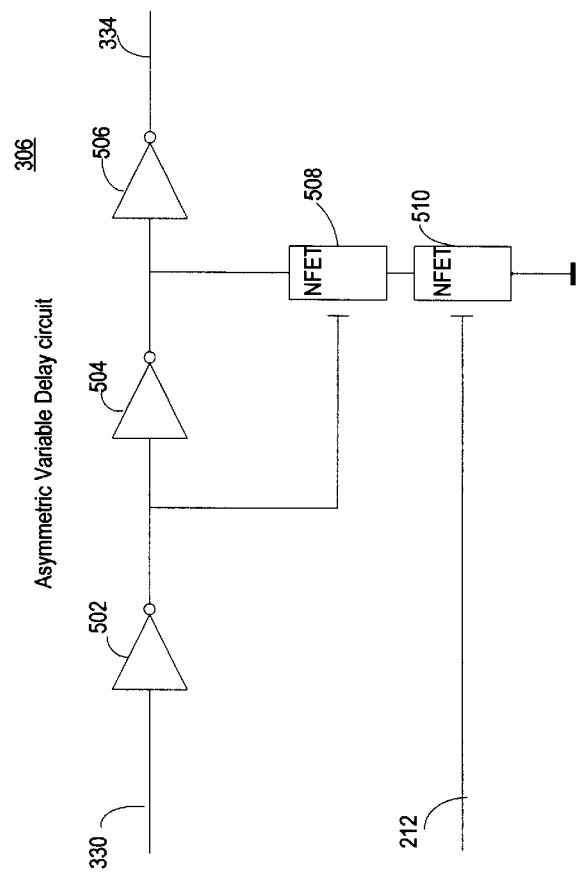

APPARATUS FOR A RADIATION HARDENED CLOCK SPLITTER

RELATED APPLICATIONS

The present invention claims the benefit of U.S. Provisional Patent Application 60/200,348, filed Apr. 28, 2000 and is related to U.S. patent application Ser. No. 09/559,660 entitled "Method and Apparatus for a Scannable Hybrid Flip Flop" to Hoffman et al., U.S. patent application Ser. No. 09/559,661 entitled "Method and Apparatus for a SEU Tolerant Clock Splitter" to Hoffman, now U.S. Pat. No. 6,362,676, and to U.S. patent application Ser. No. 09/559,659 entitled "Method and Apparatus for a Single Event Upset (SEU) Tolerant Clock Splitter" to Yoder et al., now U.S. Pat. No. 6,456,138, filed Apr. 28, 2000 and of common assignee to the present application, the contents of which are incorporated herein by reference in their entireties.

BACKGROUND OF THE INVENTION

1. Field of the Invention

The present invention is related to radiation hardened integrated circuits and, more particularly, to clock generation circuits for radiation hardened integrated circuits.

2. Related Art

Increasingly, space-based communication systems are including integrated circuits (IC) made in advanced deep sub-micron Field Effect Transistor (FET) technology. Typically, these ICs are in the insulated gate silicon technology commonly referred to as complementary metal oxide semiconductor (CMOS). CMOS ICs are advantageous in that they are high speed and low power. The CMOS ICs use little power compared to what other technologies require for comparable speed and function.

In a space-based environment, however, ionic strikes by sub-atomic cosmic particles are known to introduce circuit disturbances. These circuit disturbances are known as single event effects (SEEs), and as single event upsets (SEUs) when corrupting data in storage elements. Radiation hardened latches are well known and are used, effectively, to reduce or to eliminate SEUs in space-based IC registers, latches and other storage elements. These radiation hardened storage elements are designed to protect from disturbance what is stored in them in spite of any cosmic particle hits that the storage elements might sustain.

However, over time, as circuit performance has increased, the propagation delay through circuit logic between the radiation hardened latches or registers has been reduced to within an order of magnitude of the duration of an SEE. For example, a pipelined logic chip operating at 200 MHz can have 3–3.5 nanoseconds allocated for logic propagation delays between registers. A single event upset occurring in the logic can cause an invalid result for 0.5–1.0 nanoseconds which is a significant amount of time with respect to a pulse width. Such an event occurring in a clock distribution chain can cause a more widespread and potentially a much more serious result.

Typically, IC clock signals are received by a receiver connected to a bonding pad of the IC. The receiver inverts and redrives the clock signal, typically, to multiple locations on the IC. At each of these locations, the clock signal is again inverted and redriven. This reinverted clock signal can be further distributed to multiple locations, where it can again be reinverted and redriven. The clock distribution can be represented as a tree spreading out from the original receiver.

The effects from an event occurring in a clock tree can cause a transient effect in the clock signal on part of the clock tree for approximately 0.5 nanoseconds, which can appear as a false clock pulse. Further, the number of latches and registers affected by the false clock pulse is random and depends on where in the tree the event occurs. Such a false clock pulse can clock registers causing the registers to latch invalid data. The invalid latched data can be passed from the initial registers through the next logic stage. This can result in multiple uncorrectable multi-bit logic errors.

The severity of this problem only increases with greater levels of very large scale integration (VLSI) circuit integration because these higher levels of integration achieve higher performance through smaller features. For example, with circuits operating in the 1 GHz clock range, a single event could wipe out an entire clock cycle for the affected part of the IC logic. Thus, it can be seen that clock tree SEE immunity is critical to preventing logic errors.

For example, FIG. 6 illustrates a typical state of the art scan d-flip-flop (scan dff) 600. The scan d flip-flop 600 includes a 2:1 multiplexer 602, which is coupled to a first level sensitive latch 604. The first level sensitive latch 604 is coupled to a second level sensitive latch 606. The scan dff 600 is clocked by a clock signal 607. The clock signal 607 is split into complementary signals by inverting clock signal 607 with inverter 608. The complementary clock signals are provided to first level sensitive latch 604 and second level sensitive latch 606, gating first and second pairs of pass gates 610, 612 and 614, 616, respectively.

When selected, an input DATAIN 618 passes through the 2:1 multiplexer 602 to the first pair of pass gates 610, 612 as complementary outputs 620, 622 of multiplexer 602. When the clock signal 607 is low, pass gates 610, 612, are turned on so that data and complementary outputs 620, 622 are passed to first level sensitive latch 604 and are stored therein temporarily. With the clock signal 607 low, the second pair of pass gates 614, 616 turn off contemporaneously, and isolate the second level sensitive latch 606 from outputs 624, 626 of the first level sensitive latch 604.

The rising edge of clock signal 607 turns on the second pair of pass gates 614, 616 as the output of inverter 608 falls, simultaneously, to turn off the first pair of pass gates 610, 612. When the first pair of pass gates 610, 612 is turned off, the complementary outputs 620, 622 are isolated from the first level sensitive latch 604 and, so, data is latched in the first level sensitive latch 604. When the second pair of pass gates 614, 616 is turned on, outputs 624, 626 of the first level sensitive latch 604 are passed to the second level sensitive latch 606. The state of outputs 624, 626, is stored, temporarily, in the second level sensitive latch 606 and, simultaneously, is passed out on an output DATAOUT 628. When clock signal 607 falls, on the next clock cycle, the second pair of pass gates 614, 616 is turned off, isolating the second level sensitive latch 606 from the outputs 604, 626 of first level sensitive latch 604, latching data in the second level sensitive latch 606 to complete the clock cycle.

Normally, when the clock signal 607 is well behaved with regularly spaced high and low periods, it is sufficient that data provided to the input DATAIN 618 meet setup (i.e., be valid for a specified period prior to the rise of clock signal 607) and hold (i.e., remain valid for a specified period after the rise of clock signal 607) timing requirements. At any time other than this window around clock signal 607 rising, the state of input DATAIN 618 is specified as a "don't care" condition.

Unfortunately, an upsetting event occurring in the clock tree prior to clock signal 607 can cause a false clock pulse on clock signal 607. Since input DATAIN 618 is specified as a "don't care," a falling edge of a false clock pulse on clock signal 607 could cause the first level sensitive latch 604 to switch states, inadvertently storing data. Further, when the input clock returns high, that invalid level can be passed to the second level sensitive latch 606 and out of the scan dff 600 on output DATAOUT 128. The false clock pulse is a pulse perturbed by an SEE.

Conventional clock splitters have shortcomings. With regard to high performance circuit designs, it is desirable that SEU tolerant complementary clock signals be provided for clocking level sensitive scan design (LSSD) latches. It is also desirable that clock signals be provided that could be configured to permit controlling or managing clock skew.

Thus, for reasons stated above, and for other reasons stated below which will become apparent to those skilled in the relevant art upon reading and understanding the present specification, what is needed are clock generation circuits with reduced SEE sensitivity which could provide for improved manageability of clock skew.

SUMMARY OF THE INVENTION

The above mentioned problems with clock generation circuits and radiation hardened storage elements and other problems are addressed by the present invention and which will be understood by reading and studying the following specification.

In an exemplary embodiment of the present invention, a clock splitter circuit is disclosed including a first leg including a first and-or-inverter (AOI) circuit having a first input coupled to an overlap_enable signal, a second input coupled to an inverted overlap_enable signal, a third input coupled to an inverted first clock input signal, and a fourth input coupled to a second clock input signal that is substantially 180 degrees out of phase with the first clock input signal, a first asymmetric variable delay (AVD) circuit having an input coupled to an output of the first AOI circuit, and having an input coupled to a waitr_signal, a first tri-state inverter circuit having a first input coupled to an output of the first AVD circuit, and a second input coupled to the inverted first clock input signal, and an output coupled to a first clock output signal; and a second leg including a second and-or-inverter (AOI) circuit having a first input coupled to the overlap_enable signal, a second input coupled to the inverted overlap_enable signal, a third input coupled to an inverted second clock input signal, and a fourth input coupled to a first clock input signal that is substantially 180 degrees out of phase with the second clock input signal, a second AVD circuit having an input coupled to an output of the second AOI circuit, and having an input coupled to the waitr_signal, a second tri-state inverter circuit having a first input coupled to an output of the second AVD circuit, and a second input coupled to the inverted second clock input signal, and an output coupled to a second clock output signal.

In an exemplary embodiment of the present invention, the first clock input signal and the second clock input signal are complementary clock signals.

In an exemplary embodiment of the present invention, the first AVD circuit includes first, second and third inverters coupled in series, where an input to the first inverter is coupled to the first output of the first AOI circuit and where an output of the first inverter is coupled to an input of the second inverter, and where an output of the second inverter is coupled to an input of the third inverter, where an output of the third inverter is the first AVD output signal. In an exemplary embodiment of the present invention, the first AVD circuit also includes first and second series coupled NFETs, where a drain-source region of the second NFET is coupled to ground, where a source-drain region of the first NFET is coupled to the output of the second inverter, where a gate of the first NFET is gated by the output of the first inverter, and where a gate of the second NFET is gated by the waitr_signal.

In an exemplary embodiment of the present invention, where the first AOI circuit includes a NOR gate having an output coupled to the first output of the first AOI circuit, and first and second AND gates each having an output coupled to separate inputs of the NOR gate, where the first AND gate has a first input coupled to the overlap_enable signal, and a second input coupled to the inverted first clock input signal, and where the second AND gate has a first input coupled to the inverted overlap_enable signal, and a second input coupled to the second clock input signal.

In an exemplary embodiment of the present invention, the first tri-state inverter circuit includes first and second PFETs coupled in series, where a source-drain region of the first PFET is coupled to a $V_{DD}$ signal, a gate of the first PFET is gated by the inverted first clock input signal, and a gate of the second PFET is gated by the first output of the first AVD circuit, first and second NFETs coupled in series, coupled at a source-drain region of the first NFET to the output of the first tri-state inverter, and to a drain-source region of the second PFET, where a drain-source region of the second NFET is coupled to ground, and a gate of the second NFET is gated by the inverted first clock input signal, and a gate of the first NFET is gated by the first output of the first AVD circuit.

In an exemplary embodiment of the present invention, a clock splitter circuit for providing a radiation hardened pair of adjustably non-overlapping complementary clocks is disclosed, the clock splitter circuit including a pair of clock inverter legs, each clock inverter leg including AOI means for logically ANDing, ORing, and Inverting (AOI) a first input coupled to an overlap_enable signal, a second input coupled to an inverted overlap_enable signal, a third input coupled to an inverted first clock input signal, and a fourth input coupled to an second clock input signal that is substantially 180 degrees out of phase with the first clock input signal, asymmetric variable delay (AVD) means for delaying and adjusting a non-overlap breadth having an input responsive to a first output of the AOI means, and having an input coupled to a waitr_enable signal, tri-state means for inverting responsive to an output of the first AVD means, and responsive to the inverted first clock input signal, and generating a first clock output signal.

In an exemplary embodiment of the present invention, the AVD means includes first, second and third means for inverting coupled in series where the first means is responsive to the output of the first AOI means, where the second means is responsive to an output of the first means, where the third means is responsive to an output of the second means, and where the third means generates the first AVD circuit output signal, and first and second series coupled NFETs, where a source-drain region of the first NFET is coupled to the output of the second inverting means, where a gate of the first NFET is gated by the output of the first inverting means, and where a gate of the second NFET is gated by the waitr_signal, where a drain-source region of the second NFET is coupled to ground.

In an exemplary embodiment of the present invention, the AOI means includes first and second AND logic means for ANDing, where the first AND logic means is responsive to the overlap_enable signal, and is responsive to the inverted first clock input signal, and where the second AND logic means is responsive to the inverted overlap_enable signal, and is responsive to the second clock input signal, and NOR logic means for NORing responsive to the first and the second AND logic means and generating the first output of the AOI circuit.

It is an advantage of the present invention that integrated circuit chip SEE sensitivity can be reduced.

It is a further advantage of the present invention that pulse rejection can be provided.

It is a further advantage of the present invention that non-overlap can be controlled.

It is a further advantage of the present invention that clock skew can be controlled.

It is another advantage of the present invention that integrated circuit power can be reduced.

It is yet another advantage of the present invention that integrated circuit chip clock tree SEE sensitivity can be reduced.

It is yet another advantage of the present invention that timing related SEU sensitivity is reduced on space-based integrated circuit chips.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages of the invention will be apparent from the following, more particular description of a preferred embodiment of the present invention, as illustrated in the accompanying drawings:

FIG. 4 is a schematic diagram of an exemplary embodiment of an AND-OR-INVERTER combinatorial logic circuit of the present invention;

FIG. 5 is a schematic diagram of an exemplary embodiment of an asymmetric variable delay circuit of the present invention;

DETAILED DESCRIPTION OF AN EXAMPLE EMBODIMENT OF THE INVENTION

In the following detailed description of illustrative embodiments of the present invention, reference is made to the accompanying drawings which form a part hereof, and in which are shown by way of illustration specific illustrative embodiments in which the invention can be practiced. These embodiments are described in sufficient detail to enable those skilled in the art to practice the invention and it is to be understood that other embodiments can be used and that logical, mechanical and electrical changes can be made without departing from the spirit and scope of the present invention. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high, however, an asterisk (*) following the signal name in this application indicates that the signal is negative or inverse logic. Negative or inverse logic is considered active when the signal is low.

Figure 1:
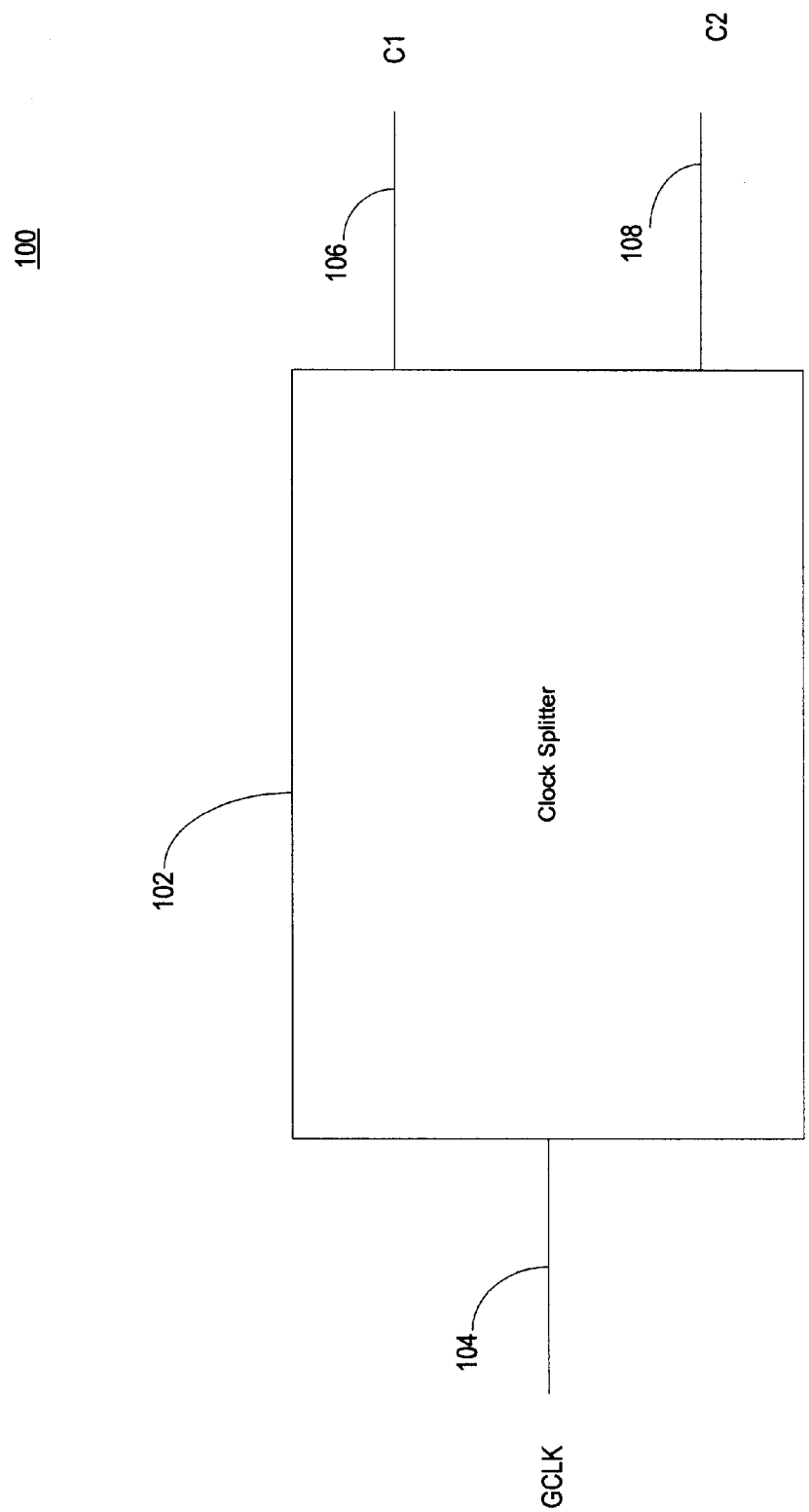
FIG. 1 is a high-level block diagram of an exemplary embodiment of a single event upset (SEU) and a single event effect (SEE) tolerant clock splitter circuit of the present invention.

FIG. 1 is a high-level block diagram of an exemplary embodiment of a single event upset (SEU) and a single event effect (SEE) tolerant clock splitter circuit of the present invention. FIG. 1 illustrates a block diagram 100 depicting an exemplary embodiment of a single event upset (SEU) and single event effect (SEE) tolerant clock splitter circuit 102. The SEU tolerant clock splitter circuit 102 includes an input GCLK clock signal 104 and generates a pair of complementary, single event upset (SEU) and single event effect (SEE) tolerant, non-overlapping clock signals C1 106 and C2 108. The output clock signals C1 106 and C2 108 are designed for high performance clock speed. For example, the clock splitter circuit 102 can feature non-overlap control and skew management which is advantageous in high speed clock design.

Figure 2:
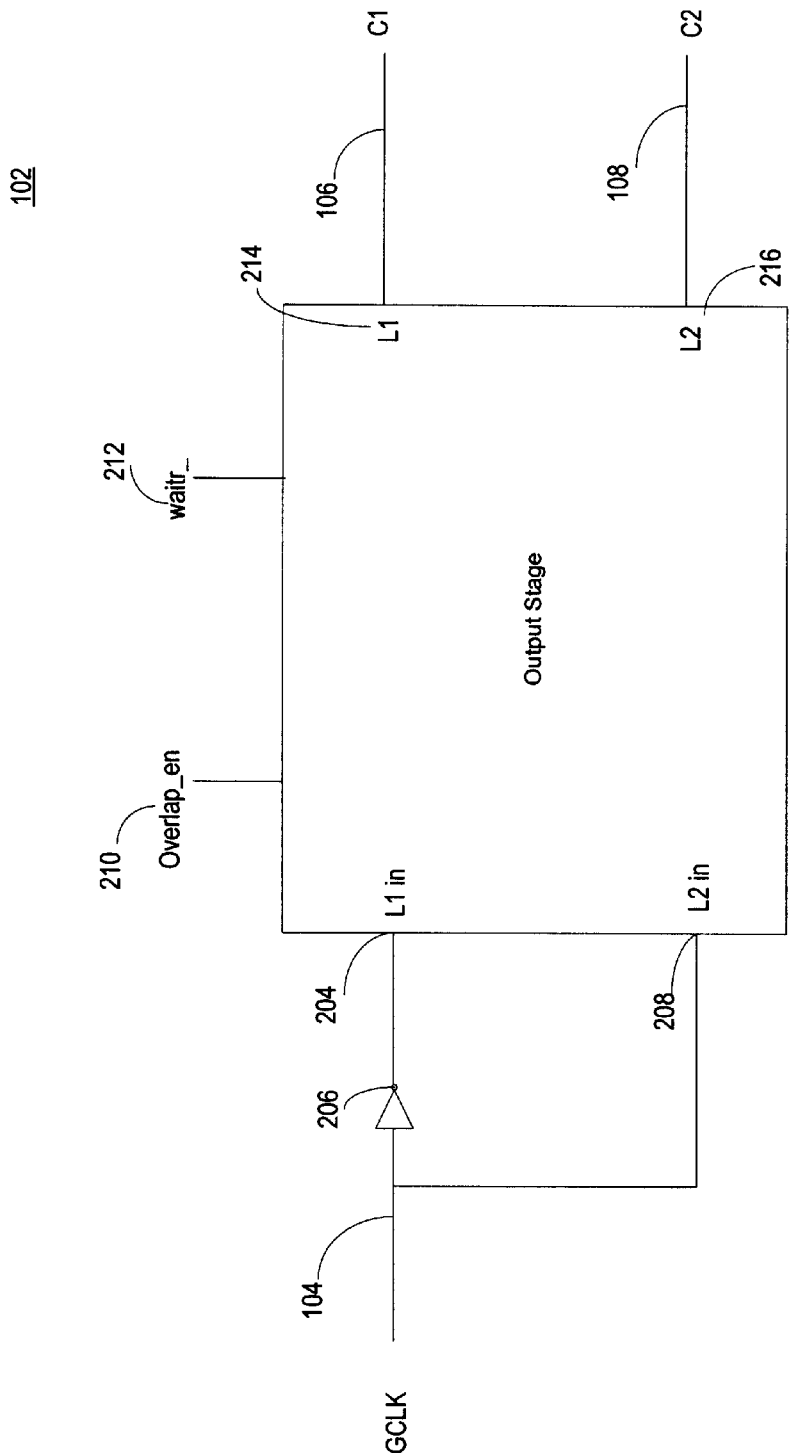
FIG. 2 is a more detailed block diagram of an exemplary embodiment of the single event upset (SEU) and the single event effect (SEE) tolerant clock splitter circuit including an output stage of the present invention.

FIG. 2 is a more detailed block diagram of an exemplary embodiment of the single event upset (SEU) and the single event effect (SEE) tolerant clock splitter circuit 102 including an output stage 202 of the present invention. The GCLK clock input signal 104, of clock splitter circuit 102, can be inverted with inverter 206 and used as L1in clock input signal 204, and can be used as L2in clock input signal 208 of output stage 202. The output stage 202 can include an L1 clock output signal 214 coupled to C1 clock output signal 106 and an L2 clock output signal 216 coupled to C2 clock output signal 108.

Output stage 202 can include an overlap_en input signal 210. The overlap_en input signal 210, when enabled, can allow the two output clock signals L1 214 and L2 216 to be in phase, e.g., for test purposes. When not enabled, the overlap_en input signal 210 will not permit the in phase clocks to go through, so the outputs can maintain their state.

Output stage 202 can also include a waitr_input signal 212 as shown. Waitr_input signal 212 can be used to permit adjustment of the timing of output clock signals 214 and 216. Specifically, waitr_input signal 212 can be enabled to control the non-overlap between the L1 214 and L2 216 output clock signals. When enabled, the waitr_input signal 212 allows for a faster rise time and therefore a smaller non-overlap value for the two output clock signals L1 214 and L2 216. When the waitr_input signal 212 is not enabled, then it has no effect.

Figure 3:
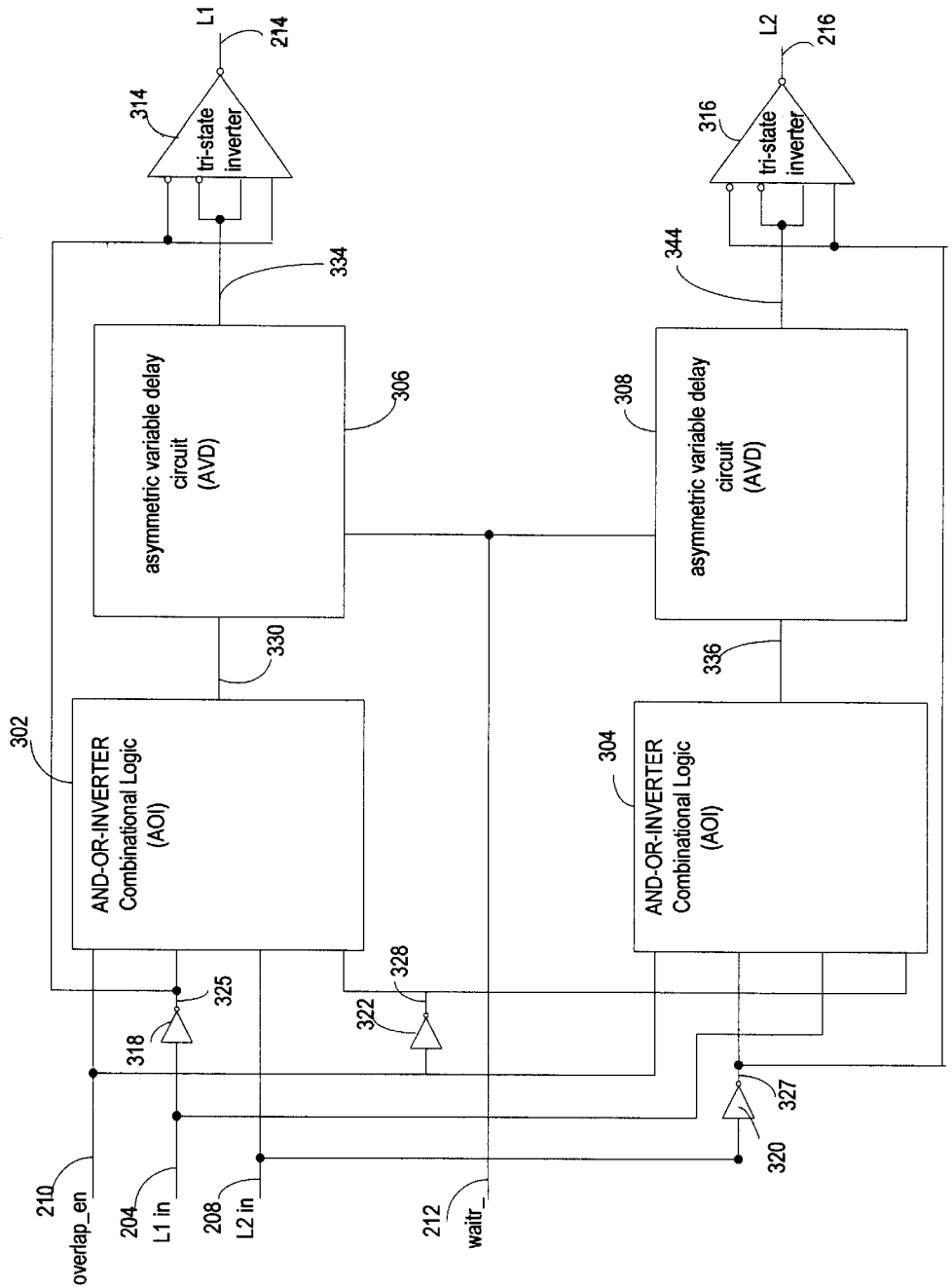
FIG. 3 is a more detailed block diagram of an exemplary embodiment of the output stage of the single event upset (SEU) and the single event effect (SEE) tolerant clock splitter circuit of the present invention.

FIG. 3 depicts a more detailed block diagram of an exemplary embodiment of the output stage 202 of the single event upset (SEU) and the single event effect (SEE) tolerant clock splitter circuit 102 of the present invention. The output stage 202 can include a first leg generating the L1 output signal 214 and a second leg generating the L2 output signal 216.

The first leg of output stage 202 can include an and-or-inverter (AOI) combinatorial logic circuit 302. AOI circuit 302 can take as input overlap_en signal 210, an output 325 of an inverter 318 having as input the L1in input clock signal 204, the L2in input clock signal 208, and an output 328 of an inverter 322 having the overlap en signal 210 as input. The AOI circuit 302 can include an output 330. Output 330 can be coupled to an input of an asymmetric variable delay (AVD) circuit 306.

AVD circuit 306 can have an output 334. The output 334 can be coupled to an input of a tri-state inverter 314. The AVD circuit 306 can have an input coupled to the waitr_ signal 212.

The tri-state inverter 314 can have an input coupled to the output 325 of inverter 318, and an output 346. The output of tri-state inverter 314 can be coupled to L1 output clock signal 214.

The second leg of output stage 202 can include another and-or-inverter (AOI) combinatorial logic circuit 304. AOI circuit 304 can take as input overlap_en signal 210, an output 327 of an inverter 320 having as input the L2in input clock signal 208, the L1in input clock signal 204, and the output 328 of the inverter 322 having the overlap_en signal 210 as input. The AOI circuit 304 can include an output 336. Output 336 can be coupled to an input of an AVD circuit 308.

AVD circuit 308 can have output 344. The output 344 can be coupled to an input of a tri-state inverter 316. The AVD circuit 308 can have an input coupled to the waitr_signal 212.

The tri-state inverter 316 can have another input coupled to the output 327 of inverter 320. The output of the tri-state inverter 316 can in turn be coupled to the L2 output clock signal 216.

Advantageously, SEU tolerance of clock splitter 202 can be obtained by use of redundancy within and between each of the first and second legs of clock splitter 202 as shown in FIG. 3. Redundant paths from either clock input signals L1in 204 and L2in 208 to tri-state inverters 314 and 316 provide the SEU tolerance feature of the present invention. Specifically, for example, a first path to the tri-state inverter 314 begins from L1in clock signal 204 running through inverter 318 to the output 325, feeding the tri-state inverter 314. A second (i.e., redundant) path to the tri-state inverter 314 begins from L2in clock signal 208 feeding through AOI 302 to output 330, through AVD circuit 306 to output 334, feeding tri-state inverter 314. The redundant first and second paths to tri-state inverter 314 cause the clock splitter 202 to be tolerant to an SEU strike. Tri-state inverter 314 maintains its current state if its inputs 325, 334 are different. Thus, if L1in clock signal 204 and L2in clock signal 208 are in phase, then tri-state inverter 314 maintains state. Also, if L1in clock signal 204 and L2 in clock signal 208 are out of phase, and an SEU strike occurs anywhere on the first leg, similarly, the tri-state inverter would not change state. Similarly to the first leg, the second leg provides internal redundancy and SEU tolerance to clock splitter circuit 202 by providing redundant paths to tri-state inverter 316.

FIG. 4 is a schematic diagram of an exemplary embodiment of the AND-OR-INVERTER (AOI) combinatorial logic circuit 302 of the present invention. AOI circuit 302 can include AND gates 402 and 404 coupled to a NOR gate 406. The NOR gate 406 can have an output coupled to output 330. The NOR gate 406 can have an input coupled to an output 408 of AND gate 402 and another input coupled to an output 410 of the AND gate 404. The AND gate 402 can have an input coupled to the overlap_en signal 210 and another input coupled to the inverted signal L1in* 325 of the L1in clock input signal 204. The AND gate 404 can have an input coupled to the inverted signal overlap_en* 328 of overlap_en signal 210 and another input coupled to the L2in clock input signal 208. It will be apparent to those skilled in the art that the AOI circuit 302 could also be used as AOI circuit 304, and that any of various logically equivalent circuits could be used to perform the function of combinatorial logic of AOI circuit 302.

FIG. 5 is a schematic diagram of an exemplary embodiment of an AVD circuit 306 of the present invention. AVD circuit 306 can include three series coupled inverters 502, 504 and 506. Inverter 502 can have an input coupled to the output 330 of AOI circuit 302, and an output which is coupled to inverter 504. Inverter 504 can have an output coupled to inverter 506. Inverter 506 can have output coupled to output 334. The AVD circuit 306 can include an N-FET transistor 508 coupled at a drain-source region to a source-drain region of an N-FET transistor 510. N-FET transistor 510 can have a drain-source region coupled to ground. N-FET transistor 508 can have a source-drain region coupled to the output of inverter 504. The gate of N-FET transistor 508 can be gated by the output of inverter 502. The gate of N-FET transistor 510 can be gated by the waitr_ signal 212. It will be apparent to those skilled in the art that the AVD circuit 306 shown in FIG. 5, in an exemplary embodiment can also be used for the AVD circuit 308 of the second leg of output stage 202 of FIG. 2. It will be apparent to those skilled in the art that other AVD circuits 306 could be used similarly enabling the advantageous adjustment of the non-overlap of output clock signals L1 and L2, 214 and 216. Use of the waitr_212 signal to adjust the non-overlap is illustrated and described further below with reference to FIGS. 8A and 8B.

Figure 6:
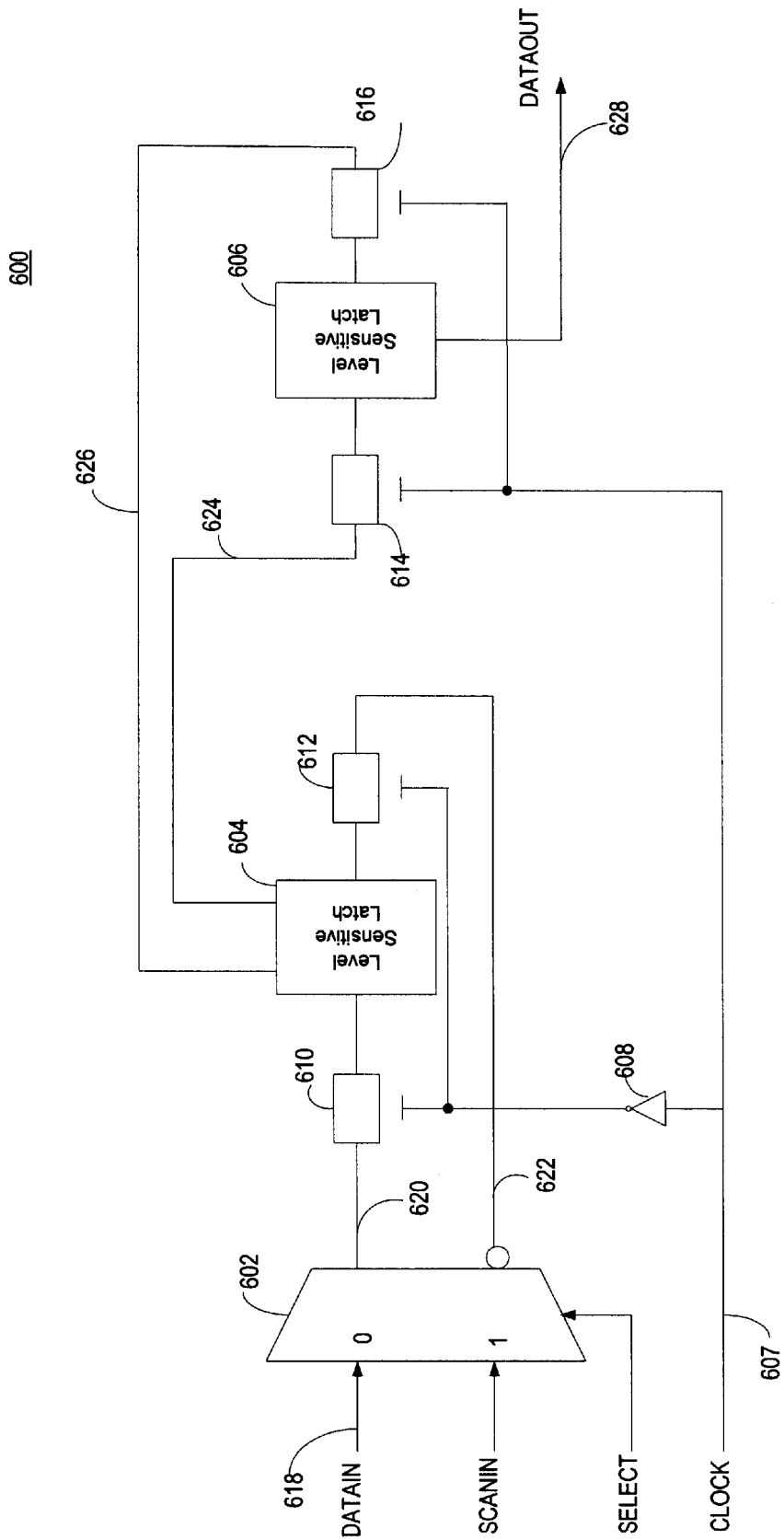
FIG. 6 is an exemplary block diagram of a conventional scan d-flip-flop.

FIG. 6 is an exemplary block diagram of a conventional scan d-flip-flop 600 already described above in the background section. The clock signal 607 and complementary clock signal provided at the output of inverter 608 could be replaced with the complementary clock output signals L1 214 and L2 216 of the present invention.

Figure 7:
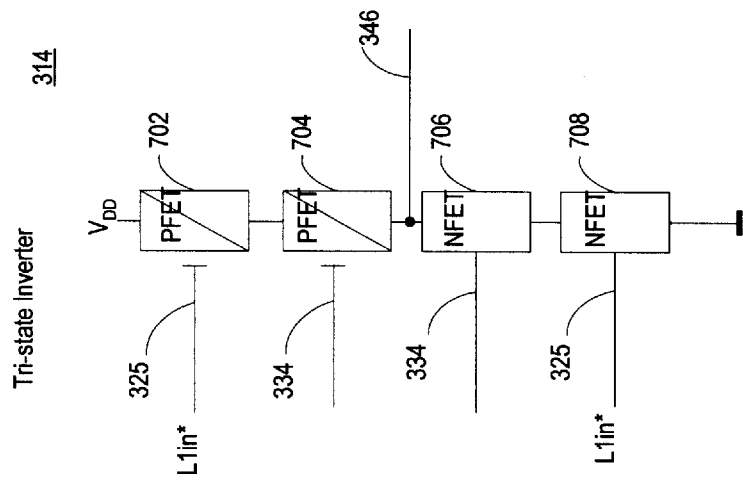
FIG. 7 is a schematic diagram of an exemplary embodiment of a tri-state inverter of the present invention.

FIG. 7 is a schematic diagram of an exemplary embodiment of tri-state inverter 314 of the present invention. The tri-state inverter 314 can include a pair of series coupled P-FET transistors 702 and 804 and a pair of series coupled N-FET transistors 706 and 708. P-FET transistor 702 can have a source-drain region coupled to $V_{DD}$ and a drain-source region coupled to a source-drain region of PFET 704. PFET 704 can have a drain-source region coupled to an output 346 of tri-state inverter 314 and to a source-drain region of N-FET transistor 706. N-FET transistor 706 can have a drain-source region coupled to a source-drain region of NFET 708. NFET 708 can have a drain-source region coupled to ground. The gate of P-FET transistor 702 can be gated by the L1in* 325 signal. The gate of N-FET transistor 708 can also be gated by the L1in* signal 325. The gate of P-FET transistor 704 can be gated by the AVD output signal 334. The gate of N-FET transistor 706 can also be gated by the AOI_DELAYED* signal 334. It will be apparent to those skilled in the art that the tri-state inverter 314 shown in FIG. 7 can be used for the tri-state inverter 316 of the second leg of output stage 202 of FIG. 2. It will be apparent to those skilled in the art that other logically equivalent tri-state inverters 314, 316 could be used similarly generating outputs 346 and 348, respectively.

Figure 8A:
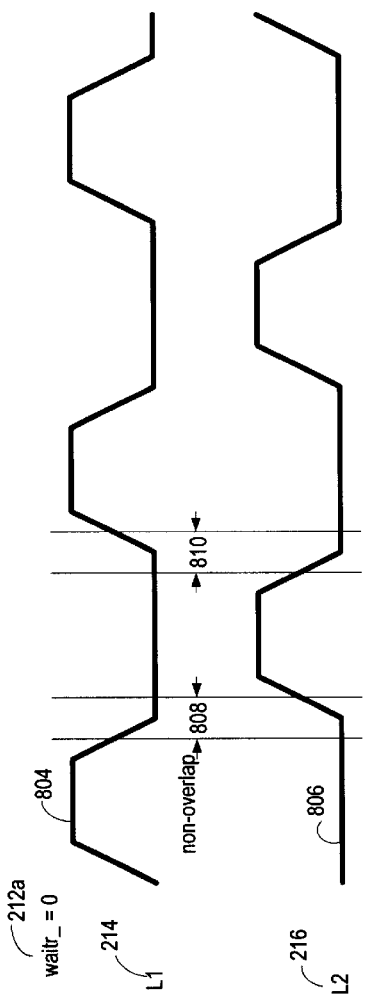
FIGS. 8A and 8B depict exemplary timing diagrams illustrating a non-overlap adjustment feature of the exemplary embodiment of the present invention.
Figure 8B:
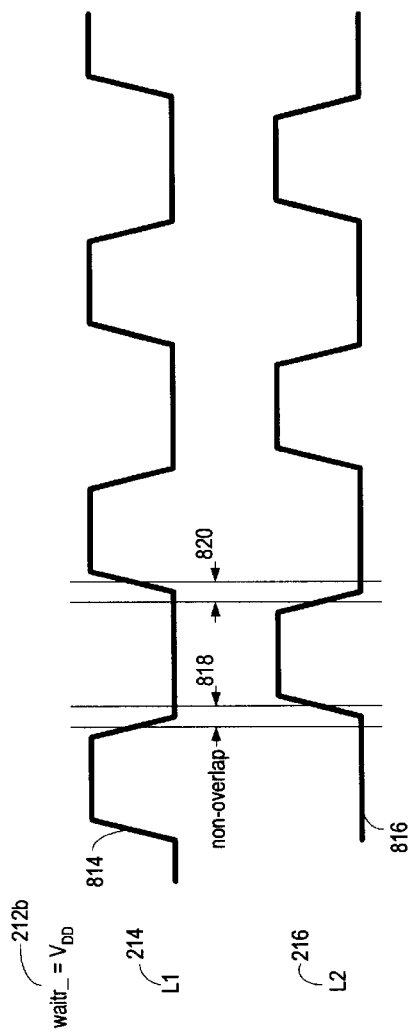

FIGS. 8A and 8B depict exemplary timing diagrams 802 and 812, respectively, illustrating the non-overlap adjustment feature of an exemplary embodiment of the present invention. As already discussed with reference to FIG. 2, above, output stage 202 can include the waitr_signal 212. Waitr_signal 212 can be used to permit adjustment of the timing of output clock signals 214 and 216. Waitr_input signal 212 can be enabled to control the non-overlap between the L1 214 and L2 216 output clock signals.

FIG. 8A depicts an exemplary timing diagram 802 showing the non-overlap between output clock signals L1 214 and L2 216 when waitr_input signal 212a is at a logic zero (0) or off. When the waitr_input signal 212 is not enabled, then NFET 50804 of FIG. 5 is off, so waitr_signal 212a has no effect on the coupled circuits. Timing diagram 802 includes a timing signal 804 representing L1 clock output signal 214, and a timing signal 806 representing L2 clock output signal 216. Note the breadths of non-overlaps 808 and 810 when waitr_signal 212a is not enabled.

FIG. 8B depicts an example timing diagram 812 showing the non-overlap between output clock signals L1 214 and L2 216 when waitr_input signal 212b is enabled at a logic one (1) or on. When the waitr_input signal 212b is enabled, then NFET 510 of FIG. 5 is on, permitting a stronger pulldown path, so the L2 clock signal 216 can rise faster minimizing the gap and decreasing the breadths of overlaps 818 and 820 as shown in diagram 812. So the waitr_signal 212b has an effect of decreasing the amount of non-overlap between the L1 clock output signal 214 and the L2 clock output signal 216. Timing diagram 812 includes a timing signal 814 representing L1 clock output signal 214, and a timing signal 816 representing L2 clock output signal 216. Note the breadths of non-overlaps 818 and 820 of FIG. 8A are narrower than the breadths of non-overlaps 808 and 810, respectively, of FIG. 8A. Thus, when enabled, the waitr_input signal 212b can allow for a faster rise time and therefore a smaller non-overlap value for the L1 214 and L2 216 clock output signals. Accordingly, waitr_signal 212 can be used to adjust the breadth of the non-overlap.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A clock splitter circuit comprising:
   a first leg comprising
      a first and-or-inverter (AOI) circuit having a first input coupled to an overlap_enable signal, a second input coupled to an inverted overlap_enable signal, a third input coupled to an inverted first clock input signal, and a fourth input coupled to a second clock input signal, wherein said second clock input signal is substantially 180 degrees out of phase with said inverted first clock input signal,
      a first asymmetric variable delay (AVD) circuit having an input coupled an output of said first AOI circuit, and having an input coupled to a waitr_signal,
      a first tri-state inverter circuit having a first input coupled to an output of said first AVD circuit, and a second input coupled to the inverted first clock input signal, and
      an output coupled to a first clock output signal; and
   a second leg comprising
      a second and-or-inverter (AOI) circuit having a first input coupled to the overlap_enable signal, a second input coupled to the inverted overlap_enable signal, a third input coupled to an inverted second clock input signal, and a fourth input coupled to a first clock input signal that is substantially 180 degrees out of phase with said inverted second clock input signal,
      a second AVD circuit having an input coupled to an output of said second AOI circuit, and having an input coupled to the waitr_signal,
      a second tri-state inverter circuit having a first input coupled to an output of said second AVD circuit, and a second input coupled to the inverted second clock input signal, and
      an output coupled to a second clock output signal.

2. The clock splitter circuit according to claim 1, wherein said first clock input signal and said second clock input signal are complementary signals.

3. The clock splitter circuit according to claim 1, wherein said AVD circuit comprises:
   first, second and third inverters coupled in series;
   wherein an input to said first inverter is coupled to the output of said first AOI circuit and wherein an output of said first inverter is coupled to an input of said second inverter,
   wherein an input of said third inverter is an output of said second inverter and wherein an output of said third inverter is the first AVD circuit output signal; and
   first and second series coupled NFETs;
   wherein a source-drain region of said first NFET is coupled to the output of the second inverter,
   wherein a gate of said first NFET is gated by the output of the first inverter, and
   wherein a gate of said second NFET is gated by the waitr_signal,
   wherein a drain-source region of said second NFET is coupled to ground.

4. The clock splitter circuit according to claim 1, wherein said first AOI circuit comprises:
   a NOR gate having an output coupled to said output of said first AOI circuit; and
   first and second AND gates each having an output coupled to separate inputs of said NOR gate, wherein said first AND gate has a first input coupled to the overlap_enable signal, and a second input coupled to the inverted first clock input signal, and wherein said second AND gate has a first input coupled to the inverted overlap_enable signal, and a second input coupled to the second clock input signal.

5. The clock splitter circuit according to claim 1, wherein said first tri-state inverter circuit comprises:
   first and second PFETs coupled in series;
   wherein a source-drain region of said first PFET is coupled to a VDD signal,
   wherein a gate of said first PFET is gated by the inverted first clock input signal, and
   wherein a gate of said second PFET is gated by the output signal of the first AVD circuit;
   first and second NFETs coupled in series;
   wherein a source-drain region of said first NFET is coupled to the output of said first tri-state inverter, and to a drain-source region of said second PFET,
   wherein a drain-source region of the second NFET is coupled to ground,
   wherein a gate of said second NFET is gated by the inverted first clock input signal, and wherein a gate of said first NFET is gated by the output of the first AVD circuit.

6. A clock splitter circuit for providing a radiation hardened pair of adjustably non-overlapping complementary clocks, the clock splitter circuit including a pair of clock inverter legs, each clock inverter leg comprising:

AOI means for logically ANDing, ORing, and Inverting (AOI) a first input coupled to an overlap_enable signal, a second input coupled to an inverted overlap_enable signal, a third input coupled to an inverted first clock input signal, and a fourth input coupled to a second clock input signal, wherein said second clock input signal is substantially 180 degrees out of phase with said first clock input signal;

asymmetric variable delay (AVD) means for delaying and adjusting a non-overlap breadth having an input responsive to a first output of said AOI means, and having an input coupled to a waitr_signal;

tri-state means for inverting responsive to an output of said AVD means, and responsive to the inverted first clock input signal, and generating a first clock output signal.

7. The clock splitter circuit according to claim 6, wherein said AVD means comprises:

first, second and third means for inverting coupled in series;

wherein said first means is responsive to the output of said first AOI means, wherein said second means is responsive to an output of said first means, wherein said third means is responsive to an output of said second means, and wherein said third means generates the first AVD circuit output signal; and first and second series coupled NFETs;

wherein a source-drain region of said first NFET is coupled to the output of the second inverting means, wherein a gate of said first NFET is gated by the output of the first inverting means, and wherein a gate of said second NFET is gated by the waitr_signal, wherein a drain-source region of said second NFET is coupled to ground.

8. The clock splitter circuit according to claim 6, wherein said AOI means comprises:

first and second AND logic means for ANDing, wherein said first AND logic means is responsive to the overlap_enable signal, and is responsive to the inverted first clock input signal, and wherein said second AND logic means is responsive to the inverted overlap_enable signal, and is responsive to the second clock input signal; and NOR logic means for NORing responsive to said first and said second AND logic means and generating said output of said AOI means.

* * * * *